United States Patent [19]
Murai

[11] Patent Number: 5,243,559
[45] Date of Patent: Sep. 7, 1993

[54] SEMICONDUCTOR MEMORY DEVICE

[75] Inventor: Ichiro Murai, Tokyo, Japan

[73] Assignee: Nippon Steel Corporation, Tokyo, Japan

[21] Appl. No.: 805,953

[22] Filed: Dec. 12, 1991

[30] Foreign Application Priority Data

Dec. 12, 1990 [JP] Japan ................. 2-401448

[51] Int. Cl.⁵ .............................................. G11C 11/34
[52] U.S. Cl. ..................................... 365/185; 365/218; 257/314
[58] Field of Search ................. 365/185, 218, 230.06; 257/23.05, 314–326

[56] References Cited

U.S. PATENT DOCUMENTS

| 4,142,251 | 2/1979 | Mintz | 365/185 |
| 4,233,672 | 11/1980 | Suzuki | 365/226 |
| 4,642,486 | 2/1987 | Honma | 365/230.06 |
| 5,097,303 | 3/1992 | Taguchi | 365/185 |
| 5,136,541 | 8/1992 | Arakawa | 365/230.06 |

OTHER PUBLICATIONS

"Polyoxide Thinning Limitations and Superior ONO Interpoly Dielectric for Nonvolatile Memory Devices", IEEE Transaction on Electron Devices. vol. 38, No. 2, Feb. 1991 pp. 270–277.

Primary Examiner—Eugene R. LaRoche
Assistant Examiner—A. Zarabian
Attorney, Agent, or Firm—Pollock, Vande Sande & Priddy

[57] ABSTRACT

A semiconductor memory device including a semiconductor substrate of a first conduction type, a memory cell having a floating gate and a control gate which are formed on a main surface of the semiconductor substrate and stacked with an interlayer insulating film interposed therebetween and having a three-layer structure of an oxide film, a nitride film and another oxide film, a decoder for supplying a voltage to the memory cell, a first well formed on the substrate surface and having a second conduction type different from the first conduction type, and a second well formed in the first well and having the first conduction type, wherein one of the memory cell and the decoder is formed in the second well.

23 Claims, 2 Drawing Sheets

SEMICONDUCTOR MEMORY DEVICE

BACKGROUND OF THE INVENTION

1. Field of the Invention

The present invention relates to a semiconductor memory device, and more particularly to an EPROM (erasable programmable read-only memory) which is electrically programmable and of which stored data can be erased by ultraviolet rays.

2. Description of the Related Art

An EPROM of which stored data can be erased by ultraviolet rays is generally known as one of electrically programmable non-volatile MOS type semiconductor memories.

FIG. 3 shows the sectional structure of a known EPROM provided with a floating gate. In FIG. 3, symbol A denotes a region in which a memory cell is formed to store data, and symbol B denotes a region in which a decoder transistor is formed to selectively apply a voltage to the control gate of the memory cell.

The EPROM is generally formed of an N-channel MOS in which a memory cell, a decoder transistor, and the like, are formed on a P conduction type semiconductor substrate 10. Actually, memory cells are arranged in a matrix and decoders are arranged around the matrix to select the memory cells.

The memory cell formed in the region A comprises a floating gate 11 for storing electrons, source (S) and drain (D) regions 12 and 13 formed of N+ diffused layers highly doped with N conduction type impurities and introducing hot electrons in the substrate 10 in programming, a thin gate oxide film 14 capable of passing the hot electrons, a control gate (CG) 15 to which a voltage is applied in reading data, and an interlayer insulating film 16 for isolating the floating gate 11 from the control gate 15 and serving as a dielectric layer constituting a coupling capacitor between the gates 11 and 15. Generally, a silicon oxide film ($SiO_2$) formed by thermal oxidation and CVD technique has been used conventionally as this interlayer insulating film 16.

The decoder transistor formed in the region B comprises source (S) and drain (D) regions 17 and 18 which are formed of N+ diffused layers highly doped with N conduction type impurities, a gate electrode (G) 19 and a gate oxide film 20 for gate isolation.

The control gate 15 of the memory cell is connected with the drain (D) 18 of the decoder transistor so that the decoder transistor selectively applies a voltage to the control gate 15 of the memory cell. Incidentally, the substrate is generally grounded.

In the EPROM constructed as described above, writing of data is carried out in such a way that hot electrons are generated in the neighborhood of the drain by applying a high voltage of 10–15 V between the source and drain of the programmable memory cell, and a voltage is applied to the floating gate 11 to inject the hot electrons thus generated into the floating gate 11. On the other hand, erasing of data is performed by irradiating ultraviolet rays onto the floating gate 11 through a quartz window provided in a package (not shown) so that the electrons in the floating gate 11 vanish.

In recent years, in order to improve the breakdown voltage characteristic between the floating gate 11 and the control gate 15 of the memory cell and reliability thereof in the EPROM as described above, the interlayer insulating film 16 is formed of, in place of the conventional oxide film in many cases, a three-layer film (hereinafter referred to as ONO film) including three layers of an oxide film ($SiO_2$), a nitride film ($Si_3N_4$) and an oxide film ($SiO_2$).

In the case where the ONO film is used as the interlayer 16 between the floating gate 11 and the control gate 15, if a voltage $V_{CG}$ is applied to the control gate 15 when collectively erasing stored data by ultraviolet rays, the control characteristic of the memory cell after the data have been erased changes so that the threshold voltage $V_{TH}$ of the control gate 15 also changes in accordance with the applied voltage $V_{CG}$. This is disclosed in e.g. "Polyoxide Thinning Limitation and Superior ONO Interpoly Dielectric for Nonvolatile Memory Devices", by Seiich Mori et al, IEEE Transaction on Electron Devices, Vol. 38, No. 2, February 1991, pp. 270 -277. As seen from FIG. 4 showing the control voltage $V_{CG}$ in data erasing and the threshold value $V_{TH}$ of the control voltage after data erasure, if a silicon oxide film is used as the interlayer insulating film 16, the threshold voltage $V_{TH}$ is fixed regardless of the magnitude of the control voltage $V_{CG}$; in contrast, if the ONO film is used, the threshold voltage lowers with lowering of control voltage $V_{CG}$. Since the data erasure has conventionally been made without applying a voltage to the control gate 15, the threshold voltage after the data erasure is 1.5 V or so even when the ONO film is used like an the case where the silicon oxide film is used.

When the EPROM is used with the power supply voltage of an ordinary 5 V series, no problem occurs. However, when the EPROM is used with a product operating with a low voltage battery of a 1.5 V series, it is required to reduce the threshold voltage. Therefore, it would be considered to apply a negative voltage to the control gate 15 in data erasing thereby to reduce the threshold voltage after data erasure to about 1–0.5 V by utilizing the characteristic of the ONO film as shown in FIG. 4. By reducing the threshold voltage to this degree, the EPROM can be operated with the battery of the 1.5 V series.

In the conventional EPROM having the sectional structure as shown in FIG. 3, the control voltage applied to the control gate of the memory cell by using a decorder transistor must be positive relative to the potential of the substrate 10. More specifically, if the control voltage were negative relative to the substrate 10, the junction between the P type substrate and the N type drain 18 should be forward-biased so that it is not allowed to apply a negative voltage to the control gate. Thus, the conventional EPROM involves a problem that in data erasing, the negative voltage cannot be applied to the control gate 15.

SUMMARY OF THE INVENTION

In order to solve the above problem of the prior art, the present invention has an object to provide an EPROM provided with an ONO film as an interlayer insulating film between a floating gate and a control gate, of which the threshold voltage of the control gate after data erasure can be reduced by applying an effectively negative voltage when erasing data by radiation of ultraviolet rays, thereby making the operating voltage lower.

In accordance with one aspect of the present invention, there is provided a semiconductor memory device comprising a semiconductor substrate with a first conduction type, a memory cell for data storage having a floating gate and a control gate which are formed on a main surface of the semiconductor substrate and stacked with an interlayer insulating film interposed therebetween and formed of a three-layer structure of an oxide film, a nitride film and another oxide film, a decoder for supplying a voltage to the memory cell, a first well formed on the main surface of the substrate and having a second conduction type different from the first conduction type, and a second well formed within the first well and having the first conduction type, wherein one of the memory cell and the decoder is formed in the second well.

The semiconductor memory device constructed as described above operates, if the memory cell is an N-channel MOS, as follows.

First, in a case where the memory cell is formed in the second well (P conduction type), the substrate (P conduction type) is grounded, a positive power supply voltage is applied to the first well (N conduction type) and a positive voltage which is lower than the power source voltage is applied to the second well (P conduction type). Then, the junctions between the substrate and the first well and between the first well and the second well are both reverse-biased, so that the substrate and the second well are fixed to ground potential and a positive potential, respectively. As a result, the ground potential at the substrate is supplied to the control gate of the memory cell through the drain (N conduction type) of the decoder section. This means that the voltage applied to the control gate is effectively negative with reference to the potential at the second well.

On the other hand, in a case where the decoder is formed in the second well (P conduction type), the second well (P conduction type) is grounded, a positive power supply voltage is applied to the first well (N conduction type) and a positive voltage which is lower than the power source voltage is applied to the substrate (P conduction type). Then, the junctions between the substrate and the first well and between the first well and the second well are both reverse-biased, so that the second well and the substrate are fixed to ground potential and a positive potential, respectively. As a result, the ground potential at the second well is supplied to the control gate of the memory cell through the drain (N conduction type) of the decoder. This means that the voltage applied to the control gate is effectively negative with reference to the potential at the substrate.

In both cases, an effectively negative voltage can be applied to the control gate of the memory cell. Due to this feature, as well as the feature of a three-layer film including a nitride film used as an interlayer insulating film of the memory cell, the threshold voltage of the control gate after data erasure can be reduced by applying the effectively negative voltage to the control gate of the memory cell when erasing data by ultraviolet rays.

DESCRIPTION OF THE PREFERRED EMBODIMENTS

Figure 1:
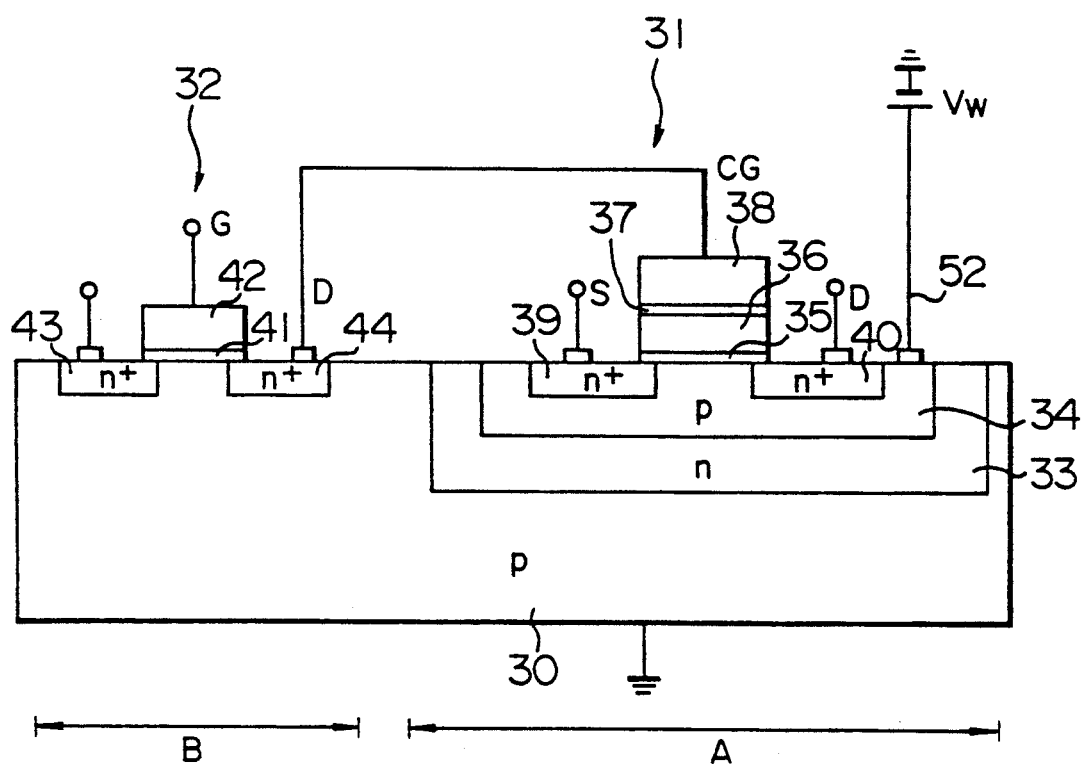
FIG. 1 is a sectional view showing the structure of the semiconductor memory device according to one embodiment of the present invention.

FIG. 1 shows the sectional structure of an N-channel EPROM according to the present invention. In FIG. 1, symbol A denotes a section where a memory cell is formed, and symbol B denotes a section where decoder transistor is formed. This EPROM is made by using a P conduction type (simply referred to P-type) silicon (Si) substrate 30 as a semiconductor substrate, forming an active region and a field region (not shown) on the substrate 30, and forming a memory cell 31 and a decoder transistor 32 in the sections A and B of the active region, respectively. Actually, as described previously the memory cells 31 are arranged in a matrix and the decoder transistors are arranged around the matrix.

This embodiment utilizes a double well structure in which a first well 33 of N-type is formed in the region A provided in a main surface of the P-type Si substrate 30 and a second well 34 of P-type is formed inside the N-type first well. With respect to the depth of each well, the P-type second well 34 has a depth of 1000–3000 nm measured from the surface of the substrate 30 and the N-type first well has a depth of 1000–2000 nm measured from the bottom of the P-type second well 34. Further, the impurity concentrations of the P-type Si substrate 30, the N-type first well 33 and the P-type second well 34 are, for example, $1 \times 10^{15}$-$9 \times 10^{15}$ cm$^{-3}$, $1 \times 10^{16}$-$1 \times 10^{18}$ cm$^{-3}$ and $1 \times 10^{16}$-$1 \times 10^{18}$ cm$^{-3}$, respectively.

The memory cell 31 is formed in the P-type second well 34. The memory cell 31 can be fabricated by known techniques to comprise a floating gate 36, a control gate (CG) 38 and source (S) and drain (D) regions 39 and 40. The floating gate 36 is 100–300 nm thick and made of a poly-Si film doped with phosphorus to reduce its resistivity, and is formed on the channel region of the memory cell transistor with a relatively thin gate oxide film (SiO$_2$) 35 interposed therebetween and having a thickness of 10–30 nm. The control gate (CG) 38 is 200–400 nm thick and made of a poly-Si film doped with phosphorus or a composite film composed of the poly-Si film and a transient metal. The control gate 38 is formed on the floating gate 36 with an interlayer insulating film interposed therebetween and formed of an ONO film 37 having a three-layer structure of an oxide film (SiO$_2$) - a nitride film (Si$_3$N$_4$) - an oxide film (SiO$_2$) and having a thickness of 10–20 nm. The source (S) and drain (D) regions 39 and 40 are formed in a surface of the P-type second well 34 at both sides of the channel region on which the floating gate 36 is formed by diffusing N-type impurities such as phosphorus (P) and arsenic (As) at a high impurity concentration (N+).

On the other hand, the decoder transistor 32 serving as a peripheral circuit for the memory cell is formed in the section B in the P-type semiconductor substrate 30. This decoder transistor is fabricated by known techniques to comprise a gate electrode (G) 42, which is similar to the control gate 38 of the memory cell 31, and source (S) and drain (D) regions 43 and 44. The gate electrode (G) 42 is formed on the channel region of the decoder transistor with a gate oxide film 41 interposed therebetween and having a thickness of 10–30 nm. The source (S) and drain (D) regions 43 and 44 are formed in the surface of the P-type semiconductor substrate 30 at both sides of the channel region on which the gate electrode 42 is formed by diffusing N-type impurities such as phosphorus (P) and arsenic (As) at a high impurity concentration (N+). The drain 44 of the decoder transistor 32 is connected with the control gate 38 of the memory cell 31 so as to selectively supply a voltage to the control gate 38 when reading data.

In the EPROM thus constructed, writing of data is performed, as explained previously, in such a way that a high voltage (e.g. 10–20 V) is applied between the source (S) and the drain (D) of the programmable memory cell 31 thereby to inject the hot electrons generated in the neighborhood of the drain (D) into the floating gate 36.

On the other hand, erasure of the stored data is performed, as explained previously, in such a way that ultraviolet rays are projected through a quartz window (not shown) so that the electrons in the floating gate 36 vanish. In the structure of the EPROM according to this embodiment, according to the characteristics of the ONO film shown in FIG. 4, the threshold voltage of the control gate 38 after data erasure is lowered sufficiently so as to make the EPROM operative with the power supply voltage of 1.5 V series. More specifically, when erasing the data, the P-type semiconductor substrate 30 is grounded, the N-type first well 33 is placed in a floating status, and the electrode 52 of the P-type second well 34 is supplied with a positive voltage Vw (e.g. 1–2 V). Then, since the N-type first well 33 disposed between the P-type substrate 30 and the P-type second well 34 is in the floating status, the P-type substrate 30 and the P-type second well are fixed to ground potential and the applied positive voltage respectively. As a result, the ground potential at the P-type substrate 30 is applied to the control gate (CG) 38 of the memory cell 31 through the drain (D) 44 of the decoder transistor 32. This means that a voltage effectively negative with reference to the potential at the P-type second well 34 is applied to the control gate (CG) 38. Therefore, when ultraviolet rays are projected for data erasure under a condition that the negative voltage is applied to the control gate 38, the threshold voltage $V_{TH}$ of the control gate 38 after the data erasure is lowered to 1 V–0.5 V in accordance with the characteristics of the ONO film shown in FIG. 4. In reading data, the N-type first well 33 is at the floating status and the electrode 52 of the P-type well 34 is at ground potential.

Figure 2:
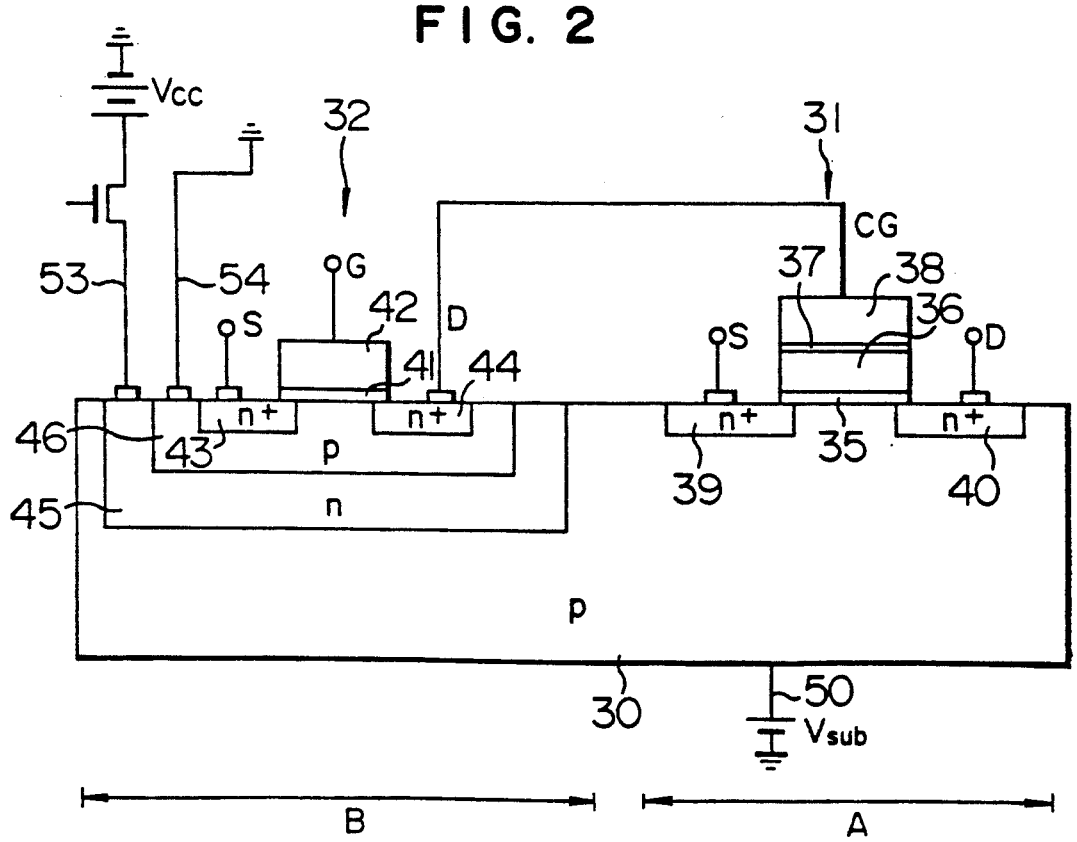
FIG. 2 is a sectional view showing the structure of the semiconductor memory device according to another embodiment of the present invention.
Figure 3:
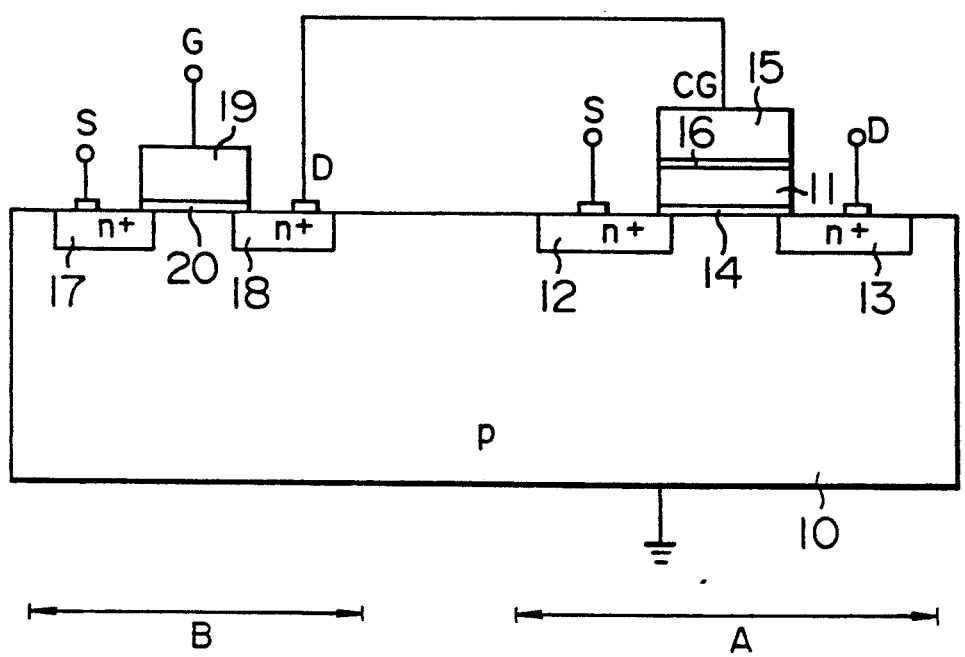
FIG. 3 is a sectional view showing the structure of the EPROM according to the prior art.

FIG. 2 schematically shows the partial sectional structure of a semiconductor memory device according to another embodiment of the present invention using an N-channel EPROM as in the first embodiment. In FIG. 2, like reference numerals and symbols designate like parts in FIG. 1.

In the EPROM according to this embodiment, the double well structure is formed in the section B where the decoder is formed, unlike the EPROM according to the first embodiment. Specifically, in this embodiment, a N-type first well 45 is formed in the P-type substrate 30, a P-type second well 46 is formed within the N-type first well and the decoder transistor 32 is formed in the region of the P-type second well 46. The depths of the first and second wells 45 and 46, and the impurity concentrations of the regions 30, 45 and 46 may be the same as those in the first embodiment.

In the EPROM according to this embodiment, in order to apply, when erasing data by using ultraviolet rays, an effectively negative voltage to the control gate 38 of the memory cell 31, the electrode 54 of the P-type second well 46 is grounded, the electrode 53 of the N-type first well 45 is supplied with a positive power supply voltage Vcc (e.g. 5 V) and the electrode 50 of the P-type substrate 30 is supplied with a positive voltage Vsub (e.g. 1–2 V) lower than one power supply voltage Vcc. Then, since the junction between the P-type substrate 30 and the N-type first well 45 and the junction between the N-type first well 45 and the P-type second well 46 are both reverse-biased, the P-type second well 46 is fixed to ground potential, and the P-type substrate 30 and the N-type first well 45 are fixed to the applied positive potentials, respectively. As a result, the ground potential is applied to the control gate 38 of the memory cell 31 through the drain (D) 44 of the decoder transistor 32 so that the voltage applied to the control voltage is effectively negative with respect to the potential at the P-type substrate 30. Thus, as in the first embodiment, the threshold voltage $V_{TH}$ of the control gate 38 after the data erasure can be lowered to 1 V–0.5 V.

When reading data, the electrode 50 of the P-type substrate 30 is at a ground potential and the electrode 53 of the n-type well 45 is at floating state.

Figure 4:
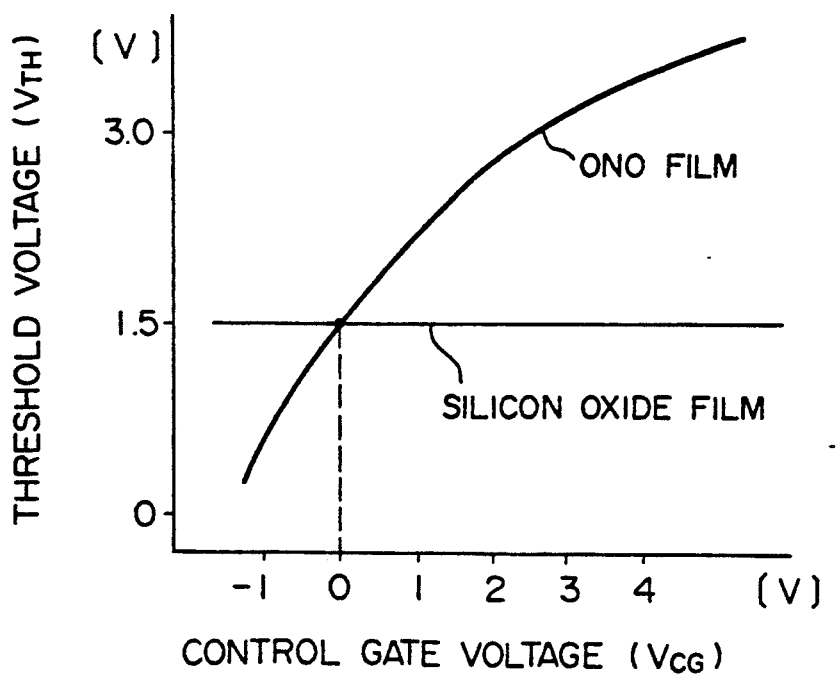
FIG. 4 is a graph showing the relationship between the voltage applied to the control gate when erasing data in an EPROM and the threshold voltage after the data erasure.

As described above, in the EPROM structure according to this embodiment, when erasing data stored in the EPROM having an N-channel, it is possible to apply an effectively negative voltage to the control gate 38 of the memory cell 31 constituting the EPROM so that the threshold voltage $V_{TH}$ of the control gate 38 can be lowered from 1.5 V in the prior art to 1 V–0.5 V in accordance with the characteristic of the ONO film shown in FIG. 4. Therefore, the operating voltage in data read can be reduced. Thus, the EPROM according to this embodiment is applicable widely not only to the ordinary product operating with a 5 V series power supply but also to the product operating with an ordinary 1.5 V battery.

As understood from the explanation hitherto made, in accordance with the present invention, when erasing stored data, a negative voltage can be applied to the control gate so that the threshold voltage of the control gate after the data erasure can be lowered, thus reducing the operating voltage of the EPROM.

I claim:

1. A semiconductor memory device comprising:
   a semiconductor substrate of a first conduction type;
   an erasable memory cell for data storage, said memory cell having a floating gate and a control gate which are stacked with an interlayer insulating film interposed therebetween and having a three-layer structure of an oxide film, a nitride film and an oxide film;
   a decoder for supplying a voltage to said memory cell;
   a first well formed in a main surface of said substrate and having a second conduction type different from the first conduction type; and
   a second well formed in said first well and having the first conduction type, wherein one of said memory cell and said decoder is formed in said second well and the other one of said memory cell and said decoder is formed in the main surface of said semiconductor substrate.

2. A semiconductor memory according to claim 1, wherein said memory cell is an N-channel MOS type EPROM, and said decoder is an N-channel MOS transistor.

3. A semiconductor memory device according to claim 1, wherein said semiconductor substrate is a P- type substrate, said first well is an N-type well and said second well is a P-type well.

4. A semiconductor memory device according to claim 1, further comprising means for applying voltages to said substrate, said first well and said second well independently of each other.

5. A semiconductor memory device according to claim 1, wherein said memory cell is formed in said second well.

6. A semiconductor memory device according to claim 1, wherein said decoder is formed in said second well.

7. A semiconductor memory device according to claim 2, wherein said MOS transistor of said decoder includes a drain which is connected through a conductor to the control gate of said memory cell 8. A semiconductor memory device according to claim 1, wherein said decoder is disposed adjacent to said memory cell.

9. A semiconductor memory device comprising:
semiconductor substrate of a first conduction type;
a first well formed on a surface of said semiconductor substrate and having a second conduction type different from said first conduction type;
a second well formed in said first well and having the first conduction type;
an erasable memory cell formed on a surface of said second well for data storage and having a floating gate and a control gate for writing data therein, said floating gate and said control gate being stacked with an interlayer insulating film interposed therebetween; and
a decoder formed on a surface of said substrate for applying a voltage to said memory cell.

10. A semiconductor memory device according to claim 9, wherein said memory cell is an N-channel MOS type EPROM and said decoder is an N-channel MOS transistor.

11. A semiconductor memory device according to claim 9, wherein said semiconductor substrate has a P-type conductivity, said first well has an N-type conductivity and said second well has a P-type conductivity.

12. A semiconductor memory device according to claim 9, further comprising means for applying voltages to said substrate, said first well and said second well independently of each other.

13. A semiconductor memory device according to claim 9, wherein said memory cell is formed in said second well.

14. A semiconductor memory device according to claim 10, wherein said MOS transistor of said decoder includes a drain which is connected through a conductor to the control gate of said memory cell.

15. A semiconductor memory device according to claim 9, wherein said decoder is disposed adjacent to said memory cell.

16. A semiconductor memory device comprising:
a semiconductor substrate of a first conduction type;
an erasable memory cell formed on a surface of said semiconductor substrate and having a floating gate and a control gate for writing data therein, said floating gate and said control gate being stacked with an interlayer insulating film interposed therebetween;
a first well formed on the surface of said semiconductor substrate adjacent to said erasable memory cell and having a second conduction type different from said first conduction type;
a second well formed in said first well and having the first conduction type; and
a decoder formed in said second well for applying a voltage to said memory cell.

17. A semiconductor memory device according to claim 16, wherein said memory cell is an N-channel MOS type EPROM and said decoder is an N-channel MOS transistor.

18. A semiconductor memory device according to claim 16, wherein said semiconductor substrate has a P-type conductivity, said first well has an N-type conductivity and said second well has a P-type conductivity.

19. A semiconductor memory device according to claim 16, further comprising means for applying voltages to said substrate, said first well and said second well independently of each other.

20. A semiconductor memory device according to claim 17, wherein said MOS transistor of said decoder includes a drain which is connected through a conductor to the control gate of said memory cell.

21. A semiconductor memory device according to claim 16, wherein said decoder is disposed adjacent to said memory cell.

22. A semiconductor memory device according to claim 9, wherein said interlayer insulating film includes a three-layer structure of an oxide film, a nitride and an oxide film.

23. A semiconductor memory device according to claim 16, wherein said interlayer insulating film includes a three-layer structure of an oxide film, a nitride and an oxide film.

* * * * *

UNITED STATES PATENT AND TRADEMARK OFFICE
CERTIFICATE OF CORRECTION

| | |
|---|---|
| PATENT NO. | : 5,243,559 |
| APPLICATION NO. | : 07/805953 |
| DATED | : September 7, 1993 |
| INVENTOR(S) | : Ichiro Murai |

It is certified that error appears in the above-identified patent and that said Letters Patent is hereby corrected as shown below:

Column 2

Line 44, please delete "decorder transistor" and substitute -- decoder transistor --.

Column 7

Line 14, please delete "of said decorder" and substitute -- of said decoder --.

Line 17, please delete "of said memory cell" and substitute -- of said memory cell. --.

Line 19, please delete "wherein said decorder" and substitute -- wherein said decoder --.

Line 34, please delete "a decorder formed" and substitute -- a decoder formed --.

Line 38, please delete "and said decorder" and substitute -- and said decoder --.

Column 8

Line 2, please delete "of said decorder" and substitute -- of said decoder --.

Line 6, please delete "wherein said decorder" and substitute -- wherein said decoder --.

Line 22, please delete "a decorder formed" and substitute -- a decoder formed --.

Line 26, please delete "and said decorder" and substitute -- and said decoder --.

Line 38, please delete "of said decorder" and substitute -- of said decoder --.

Line 42, please delete "wherein said decorder" and substitute -- wherein said decoder --.

Signed and Sealed this
First Day of February, 2011

David J. Kappos
*Director of the United States Patent and Trademark Office*